United States Patent [19]

Cardenia et al.

[11] 4,387,433
[45] Jun. 7, 1983

[54] HIGH SPEED DATA INTERFACE BUFFER FOR DIGITALLY CONTROLLED ELECTRON BEAM EXPOSURE SYSTEM

[75] Inventors: Pasquale A. Cardenia, Wappingers Falls; Thomas V. Landon, Stormville; Alfred W. Muir, Wappingers Falls, all of N.Y.

[73] Assignee: International Business Machines Corporation, Armonk, N.Y.

[21] Appl. No.: 219,700

[22] Filed: Dec. 24, 1980

[51] Int. Cl.³ .............................................. H01J 37/28
[52] U.S. Cl. ................................. 364/491; 250/492.2; 364/200
[58] Field of Search ................ 364/200, 900, 488–491, 364/518, 521, 524; 346/108, 110 R, 110 V, 158, 161; 355/3 R, 3 TE, 14 C, 14 E, 20, 86, 95; 354/5–7

[56] References Cited

U.S. PATENT DOCUMENTS

| | | | |
|---|---|---|---|
| 3,575,588 | 4/1971 | Hermann et al. | 364/491 |
| 3,587,044 | 6/1971 | Jenkins | 364/200 |
| 3,634,828 | 6/1972 | Myers et al. | 364/200 |
| 3,742,289 | 6/1973 | Koeijmans | 364/900 |
| 3,815,094 | 6/1974 | Smith | 364/900 |
| 3,820,894 | 6/1974 | Hyatt | 355/86 |
| 3,900,737 | 8/1975 | Collier et al. | 250/492 A |
| 3,924,113 | 12/1975 | Gill et al. | 364/489 |
| 4,063,103 | 12/1975 | Sumi | 250/492 A |
| 4,120,583 | 10/1978 | Hyatt | 364/490 |
| 4,259,724 | 3/1981 | Sugiyama | 364/491 |

OTHER PUBLICATIONS

Miyauchi, et al., "IC Pattern Exposure by Scanning Electron Beam . . . ," Solid State Technology, Jul, 1969, pp. 43–48.
Beasley et al., "An Electron Beam Maskmaker", IEEE Tr. Electron Devices, vol. ED-22, No. 7, Jul. 1975, pp. 376–384.
Yew, "A New EB Microfabrication System," Solid State Technology, Aug. 1975, pp. 63–64.
Sumi et al., "An Electron Beam Exposure System (VL–R1)," Japanese J. Appl. Phys., vol. 18 (1979), Suppl. 18-1, pp. 303–309.
Chang, "The Potential of Electron Beam Technology . . . ," Japanese J. Appl. Phys., vol. 16 (1977), Suppl. 16-1, pp. 9–16.
Wilson et al., "Automation of Vector Scan I Electron Beam . . . " Proc. Symp. Electron & Ion Beam Sci. & Tech., 1976, pp. 361–376.
Chang, "Vector Scan I an Automated Electron Beam . . . ," Proc. Sympos. Electron & Ion Beam Sci. & Tech., 1976, pp. 392–410.

*Primary Examiner*—Errol A. Krass
*Attorney, Agent, or Firm*—Howard J. Walter, Jr.

[57] ABSTRACT

An electron beam exposure system for forming integrated circuit patterns in which pattern data provided by either a control processor or a mass storage device is transferred through a pattern buffer interface which contains a large buffer memory, the reading and writing of which is automatically controlled by read and write logic contained within the interface. Data is transferred to the interface over busses having a data width less than the data width capable of being stored at an addressable location in the buffer memory. Automatic assembly of larger units of data is controlled by logic within the interface which requires only initialization by the control processor. Automatic address sequencing for subsequent data transfers is carried out under control of self-incrementing storage address registers and self-decrementing word count registers. Transfers of data to the electron beam column, through a pattern generator, is provided in addressable data units, while transfers to the control processor or mass storage device are provided as sub-units of an addressable data unit compatable with their respective buss widths.

4 Claims, 1 Drawing Figure

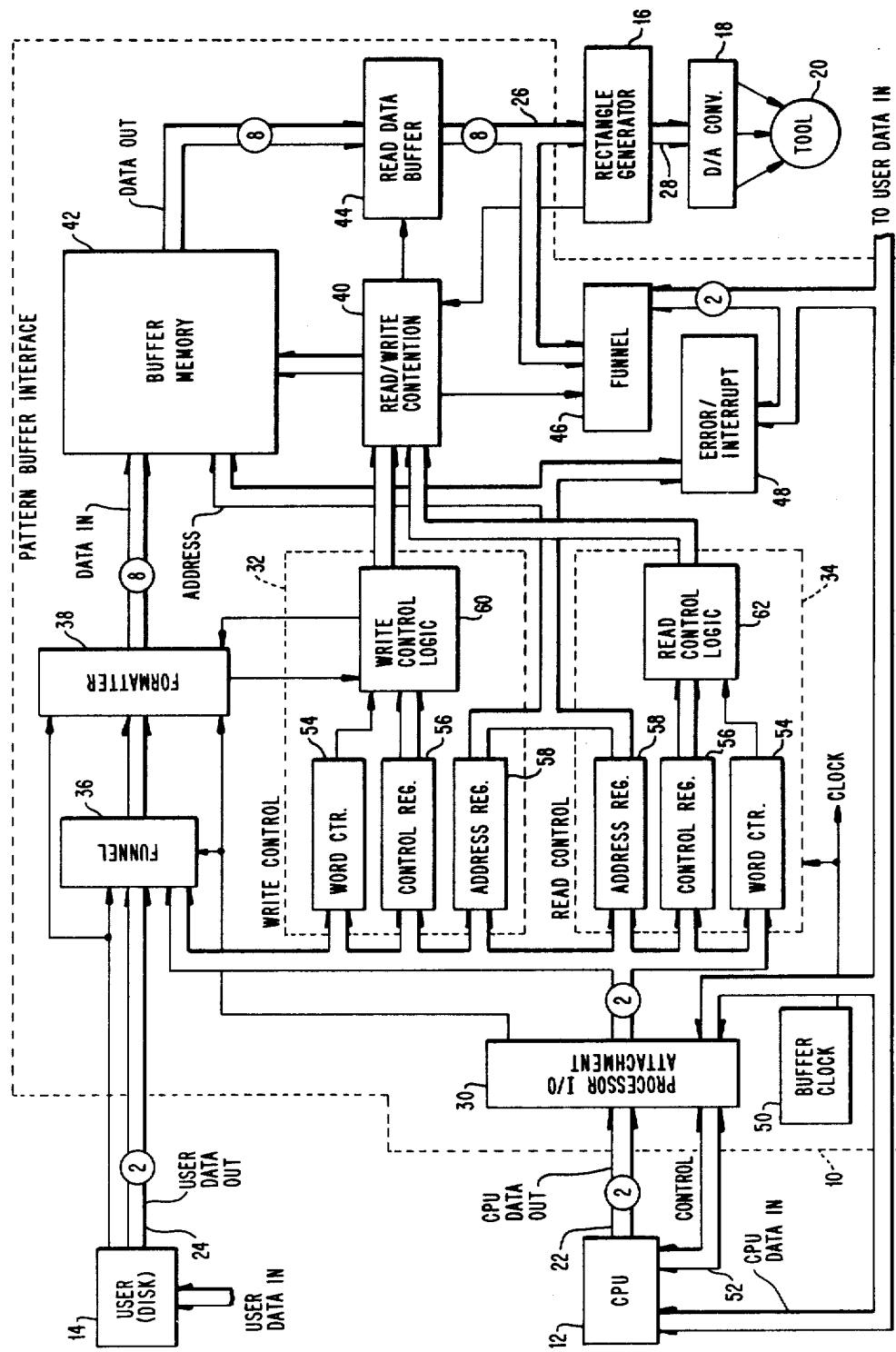

HIGH SPEED DATA INTERFACE BUFFER FOR DIGITALLY CONTROLLED ELECTRON BEAM EXPOSURE SYSTEM

BACKGROUND OF THE INVENTION

1. Field of the Invention

This invention relates to techniques for fabricating integrated circuit devices, and more particularly to techniques for using highspeed electron beams to fabricate image pattern areas requiring large amounts of digital data at a high rate of speed. Specifically, the invention relates to a data interface buffer system capable of delivering pattern data to an electron beam tool from either a pattern data storage library via a channel or a computer processing unit with minimal processor intervention.

2. The Prior Art

The use of electron beam exposure has been recognized as an important tool for integrated circuit fabrication techniques for many years. Early attempts to use electron beam exposure techniques typically required the dedication of an entire computer system in order to provide both data and control information to an electron beam column. See for example, the article by S. Miyauchi et al, "IC Pattern Exposure by Scanning Electron Beam Apparatus", *Solid State Technology*, July 1969, pp. 43-48, in which an electronic computer provides the interface between an electron beam column and its data input. The data transfer between the column and the computer being such as to require a high degree of interactive control. Several additional similar computer controlled systems are represented by U.S. Pat. No. 3,820,894 to Hyatt; the article, "An Electron Beam Maskmaker", by J. P. Beasley et al, *IEEE Tr. Electron Devices*, Vol. ED-22, No. 7, July 1975, pp. 376-84; and the article "A New EB Microfabrication System", *Solid State Technology*, August 1975, pp. 63-4. It was not unusual for such systems to require from one to several hours to expose the integrated circuit pattern of a single semiconductor wafer. All of these early systems relied on a raster scan technology in which data was required to be serially supplied continuously to the electron beam column as the beam traced patterns within a small field. In order to expose larger areas it was necessary to use a step-and-repeat technique in which the wafer or workpiece was mechanically incremented to a field adjacent to that previously exposed.

An improvement to the raster scan step-and-repeat exposure technique is described in U.S. Pat. No. 3,900,737 to Collier. In this technique a continuous stream of data is serially applied to the electron beam column while the workpiece is continuously moved under the beam, thus providing a long strip of exposed area. A typical pattern data input control for such systems includes a pair of shift registers, each having a data bit capacity equal to that of a single raster scan, which are alternately used to accept data from the computer supplying data and to transfer data to the electron beam column. Such systems are throughput-limited by the data transfer rate between the magnetic tape containing the predetermined pattern data and the computer and by the data transfer rate between the computer and the shift registers, both of which are directly under control of the computer.

A further improvement in data transfer rate is taught in U.S. Pat. No. 4,063,103 to Sumi. Here the main core memory of the computer is divided into two independent sections so that pattern data can be read from one section to the shift registers while additional pattern data is being read from a magnetic disk to the computer memory. A further improved raster scan electron beam exposure system was described by Sumi et al at the 10th Conference on Solid State Devices, Tokyo, 1978. This paper, *Japanese J. Appl. Phys.*, Vol. 18 (1979) Supplement 18-1, pp. 303-309, describes a pattern data transfer system, similar to that in U.S. Pat. No. 4,063,103, which includes a separate memory under control of a dedicated mini-computer system. Data is supplied to the memory from a magnetic disk on a demand basis and from the memory to a Direct Memory Access unit which includes the shift registers for controlling the electron beam column. The data transfer rate between the magnetic disk is less than the time required by the electron beam column to use the same amount of data, thus ensuring a continuous flow of pattern data to the electron beam column. Although disk-stored pattern data is subject to a data compaction scheme to reduce the amount of data to be stored and thus reducing the effective disk to storage data transfer time, the maximum data transfer for this system is 20,000,000 bits (20 M bits) per second. This data rate requires about one hour to expose an integrated circuit pattern of 2 micron features on a 100×100 mm² substrate.

A second electron beam exposure technique is referred to as a vector scan technique, the general characteristics of which are described in the paper presented by T. H. P. Chang at the 8th Conference (1976 International) on Solid State Devices, Tokyo, 1976, see *Japanese J. of Appl. Phys.*, Vol. 16 (1977) Supplement 16-1, pp. 9-16. In the vector scan technique small geometrical shapes, usually rectangles, are traced by the electron beam after being first positioned to a reference point on the surface to be exposed. The vector scan technique enables the quantity of pattern data to be reduced because only the location, shape and size of the rectangle are required for each subunit of the pattern. A step-and repeat technique is used to move the workpiece from one area to another, each of which may contain a number of rectangles. The article "Automation of Vector Scan I Electron Beam Lithographic System", A. D. Wilson et al, Proceedings of the Symposium on Electron and Ion Beam Science and Technology, Seventh International Conference, Washington 1974, pp. 361-376, describes the system features of a particular version of a vector scan system. Here an IBM 1130 Processor having a 32K word core memory is used as a temporary data storage buffer for pattern data initially stored on a magnetic disk. Data from the magnetic disk is transfered to one of an A or B section of core storage over a high speed Storage Access Channel (SAC) which operates under control of the 1130 on a cycle steal basis. That is the 1130 is interrupted during any SAC transfers. Data from the core memory is transferred to a cache memory having a capacity of 256 words at a transfer rate equal to that of the cycle time of the core memory, 2.5 microseconds per word. After initial loading of 256 words into the cache memory, further data transfers are not made until the cache word count is reduced by the pattern generator to 190 words at which time the cache is refilled. Data can be fetched by the pattern generator from the cache in about 0.4 microseconds per word. For the 16 bit word used, the maximum data transfer rate is about 40 M bits per second, or about twice that of the above second described system of Sumi.

The article, "Vector Scan I, An Automated Electron Beam System for High Resolution Lithography", T. H. P. Chang et al presented at the same conference as that of Wilson, above, at pp. 392-410, is of interest as it discusses various operating parameters and limitations of electron beam exposure systems. Two items in particular are pertinent. One is that electron beam exposure systems are data throughput-limited and the other is that the beam hardware is capable of operating at much higher data rates than that of the above systems. In particular, beam stepping rates of at least 30 MHz and up to several thousand MHz can be achieved.

SUMMARY OF THE INVENTION

Accordingly it is an object of this invention to provide a data buffer interface for an electron beam exposure system having a very high data throughput on the order of several hundred M bits per second.

Another object is to provide a data buffer shared by a processor and a pattern writer which greatly reduces processor involvement in data transfers within the system.

A further object is to provide a data buffer independent of typically slow channel, process or periphial storage device transfer rates which operates at high memory access speeds.

Yet another object is to provide a data buffer interface with multiple access ports, capable of accepting data directly from a processor as well as through a simple channel interface alternative input, and which can provide data to a processor, a pattern writer or an alternate output.

These and other objects are accomplished by a data buffer interface including a large high speed memory capable of providing pattern generating data in parallel to a pattern generator. Independent read and write circuitry initiated by a channel attached processor provide for automatic storage control in response to an independent buffer clock. Multiple data source ports allow the buffer to be coupled to mass storage devices such as magnetic disk systems which input data directly to the buffer interface memory under control of the interface logic.

BRIEF DESCRIPTION OF THE DRAWING

A better understanding of the invention may be had by reference to the drawing which shows in block diagramatic form a specific embodiment of the data buffer interface including the interconnection of the various elements.

DESCRIPTION OF THE PREFERRED EMBODIMENT

Previous electron beam pattern writing systems have been implemented using data stored in processor libraries (periphial disk files) connected to the processor via I/O attachment ports (channels). The electron beam pattern writers, configured as periphials, were also connected to the processor by a channel.

During pattern writing, pattern (application) data was transferred from the disk library, through its control unit to the processor. Data was buffered there to accommodate degradation of data rates encountered when stored data bridged head and cylinder boundaries. Another channel transfer followed, this time from the processor buffer to the pattern writer. Data was buffered there to guard against surges in data consumption created by real time writing techniques.

Because of the lengthy data transfer sequence, which included typically slow periphial equipment and channel data rates, and extensive, almost 100%, processor involvement, average pattern writing rates were limited to less than 0.8 Mbytes/sec. and typically 0.5 Mbytes/sec. One byte equals 9 data bits.

This invention includes a novel, new digital pattern data buffer implementation of greater flexibility which eliminates previous data rate difficulties through the use of a large capacity, high performance storage unit, shared by both processor and pattern writer, plus a highly innovative memory interface. The implementation develops data rates comparable to memory access rates rather than typically slow channel data rates. With this approach, a data rate enhancement of greater than five is achieved over prior art systems.

The buffer interface is able to support pattern writing while simultaneously over-writing (updating) existing, but no longer useful, data when wafer data exceeds the buffer capacity. All the necessary patterns for some wafers may, however, be totally containable in the buffer. Unlike the first case, no update after the initial load is then required. Ample time to fully initialize the buffer with new data is provided during each wafer load time.

Wafers with a wide variety of large patterns are handled effectively using the dynamic approach. Pattern writing begins after the buffer is initialized, during wafer load time, with those patterns planned for the earliest wafer sites. When anticipated patterns are not resident in the buffer interface, they are inputted from the processor or other source and used to over-write those patterns that are not to be used again or least those which are not current in the pattern forecast. In the extreme cases for wafers with many small patterns, or fewer large patterns used repeatedly, the need for updating is greatly reduced or eliminated. Any pattern in the buffer may be accessed without need to return to the disk library, as patterns are available from the buffer location in which they have been previously stored. The maximum number of patterns available in the buffer is directly proportional to the storage buffer size and inversely proportional to the average pattern size.

Most of the buffer advantages are a result of the buffer interface design. It allows overlapped buffer reading and writing. This is accomplished by two separate, but interactive sets of control logic. These sets include separate storage address registers (SAR's), word counters, control registers, etc. allocated to reading and writing. It is the independence of this control logic from the processor by the use of self incrementing SAR's, decrementing WC's, and separate memory clock, plus the ability to retain and access frequently used patterns in storage that allows the processor to perform other tasks. This enables use of a smaller, less expensive processor as the system controller. For example, an IBM Series/1 processor is used in the preferred embodiment.

An alternate data input to the buffer reduces processor involvement even more. Data may be inputted directly from the library (disk). The primary task of the processor now becomes that of control. Writing the next planned pattern is simply a matter of initializing the Storage Address Registers and the Word Count Register, then enabling the pattern writer output.

GENERAL DESCRIPTION

The pattern buffer consists of an IBM 3168 Memory Unit and its associated interface logic referred to as the Buffer Interface. The 3168 Memory contains common logic for fetching double words (8 BYTES) from, or for storing double words into, the data arrays. The storage unit is divided into four logical storage units (LSU's). Any one LSU may be selected every 320 nanoseconds. Storage access operations may be overlapped by selecting a different LSU in each Machine cycle (80 nanoseconds). Further descriptive information of the memory of IBM System/370, Model 168 can be found in the following International Business Machines Documents: "A Guide to the IBM System/370, Model 168", Document Number GC20-1774 and "System/370, Model 168 Theory of Operation", Volumes 1-4, Document Number SY22-6931 through -6934.

The function of the Buffer Interface is to provide integrated hardware and software controls for simultaneously reading and writing the IBM 3168 memory from multiple READ/WRITE ports. There are five ports in all, two for writing the memory and three for reading. The two writing ports are the processor and the user in ports. The user in port is intended for standard IBM channel compatible type devices. Although the writing ports are two bytes wide, this does not represent a restriction to input data in that the Buffer Interface may be easily reconfigured to also accept data 1, 4 or 8 bytes wide. The read data or output ports include a Processor, Channel and Rectangle Generator. The Rectangle Generator port is 8 bytes wide while the others are two bytes wide.

DETAILED DESCRIPTION

Referring now to the drawing, the electron beam exposure system includes the Pattern Buffer Interface unit 10, a control processor unit, CPU, 12, a user data source 14, which may be a disk storage file, and a rectangle generator 16, generally referred to as a pattern generator. The rectangle generator is coupled by a Digital-to-Analog Converter 18 to the electron beam column or tool 20. Data paths are shown as wide arrows interconnecting various units. Each path bears an encircled numeral representing the data width of the path in 9-bit data bytes. Some of the logical interconnections are shown by solid arrows indicating the direction in which controls are propogated between logical subunits of the pattern Buffer Interface.

External to the Pattern Buffer Interface 10 data flows from either CPU 12 or user 14 into the Interface unit where it is stored. Data is transferred from these sources on 2 byte wide, 18 bit, data busses 22 and 24. Data stored in the Interface is transferred on request to Rectangle Generator 16 over an 8 byte, 72 bit, wide buss 26. Data on buss 26 is sufficient to define the location, shape and size of each sub-pattern to be scanned by the electron beam unit. Digital data is supplied over buss 28 to the D/A converter 18 which controls tool 20. Various details of the operation of electron beam tool 20, such as feedback data loops used for positioning control have been omitted, as these can be any of several known in the prior art.

Internal to Pattern Buffer Interface 10 are provided Processor Attachment 20, programmable write control circuitry 32, programmable read control circuitry 34, input data funnel 36, formatter 38, read/write contention control 40, buffer memory 42, read data buffer 44, output data funnel 46, error and interrupt reporting unit 48 and interface buffer clock 50.

The CPU interface includes CPU Data/In buss 22 and a CPU control buss 52. Buss 52 includes two register group select lines for write and read status control selection, two register select bits which when decoded enable the selection of four registers within the Write Control or Read Control logic, a write strobe line and system status and reset lines. All of the internal timing of the Pattern Buffer Interface 10 are under control of the buffer clock 50.

The Read and Write control logic sections of the interface consist of two register groups, one for the write memory controls, the other for the read memory controls. Each group contains a word counter 54, a control register 56 and a storage address register 58. The word counter and storage address register are self adjusting registers controlled by buffer clock 50. The word counter 54 will provide a means for setting the byte count in a data transfer as well as determining the end of the data transfer. The word counter is a 16 bit register that is decremented each time a double word (8 bytes) is stored or fetched from the memory. A word count underflow signal is generated when the word count has been exhausted. This action will return an interrupt to the system controller thru the buffer interface. Up to the full capacity of the buffer can be transferred to memory before reinitialization of the word counter is necessary.

The control registers 56 enable selectable memory operations. They are used to mask buffer interrupts, provide system resets, condition read/write controls and set up the source and destinations for the read and write memory operations.

The storage address registers 58 point to an address in memory where data may be found or stored. These storage address registers, 20 bits each, are self incrementing. They provide addressing of the memory on a double word boundry up to 8 megabytes. The storage address registers are incremented after each store or fetch operation is requested. The addressing hardware is designed such that an address that would overflow pattern data in one LSU is automatically redirected to an address in the next sequential LSU.

The input data funnel 36 and the formatter 38 provide pattern data selecting and formatting. The source of pattern data for the memory may come from either the processor or an alternate channel compatible port. The actual input data port selected is defined by a bit in the write control register. The selected input data is formatted such that an 8 byte broadside write to the buffer memory 42 is forced each write cycle.

Formatting of the data and the initiation of a write memory request is controlled by the write control logic unit 60.

The read control, write control and read/write contention circuits 60, 62 and 40 in the buffer interface provide the control signals required for the following data tranfers.

Two to eight byte formatting of the CPU or user input data when writing to buffer memory 42.
 Eight to two byte funneling when reading back to the processor or any channel type device.
 A full eight byte data transfer to the Rectangle Generator.

The read/write data rates are limited only by the buffer memory access time, 80 nanoseconds in the case of the Model 168 memory. This data rate assumes 4 way interleave mode of operation.

Read/write contention for control of the interface is resolved by a read/write clock. Given a read or write operation in process, the contention circuitry will stack either or both incoming read or write requests until the current request returns a clear signal which will allow servicing of one of the pending memory requests.

Depending on the read data configuration to be used, the data output may be either eight or two bytes wide. At the Rectangle Generator 16 the data will be eight bytes wide. The Read Data Buffer 44 is 8 bytes wide by 1 bit deep and services all read data ports. The two bytes of data sent to the CPU or user ports, by way of the funnel 46, are stripped off of the read data buffer in a sequential manner, 2 bytes at a time under control of the read/write contention circuitry 46. This control circuitry also initiates a new 8 byte read to the read data buffer after the previous 8 bytes have been transferred, two bytes at a time, thru funnel 46 to either of the two byte wide ports coupled to the CPU or user. Reading to the user or Rectangle Generator ports is independent of CPU involvement after initialization.

The error and interrupt reporting unit 48 collects data and storage address errors from the Buffer Memory and the Buffer Interface when such errors are evident in normal running mode or when they are forced as in a diagnostic mode. These errors are then presented to the Processor I/O attachment 30 via the appropriate interrupt. Through a system control buss 52 data and address errors may be read back to the CPU for diagnostics.

The Processor I/O Attachment 30 presents to the Buffer Interface a selected number of control signals required to load memory control registers and to read or write the memory through the processor or user input ports. This attachment also stacks Buffer Interface interrupts.

Throughout the Buffer Interface, the size of the registers used has been dictated by the peripherals, attached to the Pattern Buffer Interface. The size of the registers used in this particular system design could, if needed, be modified to accommodate many different data formats. The new register sizes would be dictated by the new system architecture.

GENERAL BUFFER OPERATION

To write data into the Pattern Buffer Interface 10 from either of the writing ports requires initialization of the memory control registers 56 and memory cycling. The process of initialization involves first setting a word counter 54 up with the number of double words to be stored in memory, second setting the starting address of the data to be stored in the storage address register 58, and third setting up the control registers 56 with the appropriate operation to be performed, as well as any conditions for the operation. Initialization completed, the processor or channel user-in-port transfers control to the Pattern Buffer Interface and the hardware goes into a cycling mode for the data transfer under control of the buffer clock. In the case of a Series/1, CPU, each cycle would transfer two bytes of data thru the funnel 36. The input data is formatted to 8 bytes at which time a write request is made to the write control logic unit 60 of the buffer interface. With the advent of the write clock signal a write initiate will be issued by the contention circuits 40 to the Buffer Memory 42. At this time the common logic of the buffer memory will latch up the data and the storage address for the write request. The data and storage address are checked for errors. The data is then stored at the addressed storage location specified. At the end of the write request, the word counter is decremented and the storage address register is incremented. Assuming no errors, this process will continue until the word counter has been depleted, at which time the data transfer will stop and an interrupt will be returned to CPU 12 via the processor I/O attachment 30.

Reading data from the Buffer back to the processor or user ports requires the same initialization and cycling processes used when writing. Data is moved to either port by first reading out 8 bytes of data to the read data buffer 44. Data is then taken from the read data buffer in two byte increments and directed to the appropriate read port. The process of sequentially steering data from the read data buffer to the processor or user data out ports is controlled by the read control logic circuitry 62. The read circuitry outputs serve as selector inputs to funnel 46 the input of which are attached to the read data buffer 44 output.

After a double word of data has been taken from read data buffer 44, (every four processor or user read cycles) a read request is presented to the read/write contention circuitry 40. This request is latched up pending any in-process memory request. If no memory requests are pending, the read request will be initiated on the first occurrance of the read clock. After the read request is initiated, the address of the data to be fetched is checked for parity and then sent to the memory arrays.

The fetch operation is then followed by data checking. At the end of an LSU cycle time, (320 ns after read initiate) the fetched data is then latched into the read data buffer 44. At this point data is available to funnel 46, and once again can be directed to the user or processor ports. This process is continued until the read word counter underflows, signifying the end of data transfer, returning an interrupt to the CPU.

When reading to the Rectangle Generator 16 the process of initialization remains unchanged. The initiation of the read cycle comes from the Rectangle Generator. Each read cycle originating from the Rectangle Generator produces a read request to the buffer. Data is again latched into the read data buffer 44 at the end of the memory cycle period. Each data transfer to the Rectangle Generator is 8 bytes wide.

The transfer of data from the read data buffer 44 to the Rectangle Generator 16 is a function of a clock time in a memory cycle or a signal from the Rectangle Generator. Read requests from the Rectangle Generator continue at a rate determined by the rate at which the Rectangle Generator is using the pattern data. Again a read word counter underflow terminates data transfer and sends the appropriate interrupt to the CPU.

A data buffer, independent of typically slow channel, processor or periphial storage device data rates, has been described. The buffer in the configuration described operates at a data rate to the pattern generator of 8 bytes per 320 nanoseconds or 24 M bytes per second. This is equivalent to 216 M bits per second and much more closely matches the rate at which data can be used by the electron beam column than possible in prior art systems.

While the invention has been described in terms of a single embodiment, those skilled in the art will recognize that many variations are available within the scope of the invention as claimed.

What is claimed is:

1. An electron beam exposure system for forming integrated circuit patterns, said system including a source of vector scan pattern data in digital form stored in a mass storage device, a control processor unit, a pattern generator coupled to an electron beam column for generating, within a predetermined time period, discrete circuit patterns from units of data, each unit representative of the location and shape of a predetermined integrated circuit image, and a pattern buffer interface interconnecting said mass storage device and said control processor to said pattern generator, the improvement wherein said pattern buffer interface comprises:

a random access buffer memory unit for addressably storing said units of vector scan pattern data, said buffer memory unit being responsive to memory address signals and to read and write signals to execute a memory access cycle within a time period greater than said predetermined time period;

write control logic means responsive to an address signal and a plurality of write control signals provided by said control processor for controlling the automatic transfer of a first predetermined number of said units of addressable data from a selected one of said mass storage device and said control processor unit to said first predetermined number of addressable locations in said buffer memory unit by generating, independently of said control processor unit, said first predetermined number of memory address signals and a like number of said write signals;

read control logic means responsive to an address signal provided by said control processor unit and being responsive to a plurality of read control signals provided by said control processor unit and said pattern generator for controlling the automatic transfer of a second predetermined number of said addressable units of pattern data from said buffer memory unit to said pattern generator by generating, independently of said control processor unit, said second predetermined number of memory address signals and a like number of read signals in response to read request signals provided by said pattern generator; and buffer interface clock means coupled to said read and said write control logic means for controlling the timing of said automatic transfers of data within said pattern buffer interface, independently of said control processor unit, whereby said pattern generator receives said units of vector scan data at a rate substantially equal to said memory access cycle time period.

2. The electron beam exposure system of claim 1 further including a read data buffer for storing at least one unit of said vector scan pattern data read from said buffer memory prior to being transferred to said pattern generator.

3. The electron beam exposure system of claim 2 wherein data transfer between said pattern buffer interface and said control processor and said mass storage device is accomplished over data busses having data transfer widths of a size less than that of a unit of vector scan pattern data.

4. The electron beam exposure system of claim 4 further comprising a data in funnel and a data out funnel under control of said write and read control logic means for controlling the transfers of data between said pattern buffer interface and said control processor unit and said mass storage device.

* * * * *